United States Patent
Fong et al.

(10) Patent No.: US 11,451,204 B2
(45) Date of Patent: Sep. 20, 2022

(54) JOSEPHSON PARAMETRIC AMPLIFIER BASED ON SUPERCONDUCTING-NORMAL-SUPERCONDUCTING JUNCTION

(71) Applicant: RAYTHEON BBN TECHNOLOGIES CORP., Cambridge, MA (US)

(72) Inventors: Kin Chung Fong, Concord, MA (US); Guilhem Ribeill, Arlington, MA (US); Luke Colin Gene Govia, Somerville, MA (US); Martin Gustafsson, Cambridge, MA (US); Thomas A. Ohki, Arlington, MA (US)

(73) Assignee: Raytheon BBN Technologies Corp, Cambridge, MA (US)

( * ) Notice: Subject to any disclaimer, the term of this patent is extended or adjusted under 35 U.S.C. 154(b) by 274 days.

(21) Appl. No.: 16/796,871

(22) Filed: Feb. 20, 2020

(65) Prior Publication Data
US 2020/0274507 A1    Aug. 27, 2020

Related U.S. Application Data

(60) Provisional application No. 62/809,056, filed on Feb. 22, 2019.

(51) Int. Cl.
*H03F 19/00* (2006.01)
*H01L 39/22* (2006.01)

(52) U.S. Cl.
CPC ........... *H03F 19/00* (2013.01); *H01L 39/223* (2013.01)

(58) Field of Classification Search
CPC .............................. H03F 19/00; H01L 39/223
USPC .......................................................... 330/4.5
See application file for complete search history.

(56) References Cited

U.S. PATENT DOCUMENTS

| | | | | |
|---|---|---|---|---|
| 5,963,351 A | * | 10/1999 | Kaplounenko | H03K 3/38 329/346 |
| 2011/0065586 A1 | * | 3/2011 | Maibaum | G06N 10/00 505/170 |

OTHER PUBLICATIONS

Nakada et al. "Improved Critical-Current-Density Uniformity by Using Anodization", IEEE Transactions on Applied Superconductivity, vol. 13, No. 2, Jun. 2003 (Year: 2003).*
Räisänen, "Development of a lumped element Josephson parametric amplifier for frequencies below 1 GHz", Master's thesis, Alto University, Espoo, Finland, 2015 (Year: 2015).*
Shalom et al., "Quantum oscillations of the critical current and high-field superconducting proximity in ballistic graphene", Nature Phys 12, 318-322 (2016) (Year: 2016).*
Wei, H., "Towards the Fabrication of Suspended Superconductor-Graphene-Superconductor Josephson Junctions", MIT, Jun. 2011 (Year: 2011).*

(Continued)

*Primary Examiner* — Hafizur Rahman
(74) *Attorney, Agent, or Firm* — Lewis Roca Rothgerber Christie LLP

(57) ABSTRACT

An amplifier. In some embodiments, the amplifier includes a resonant circuit having a resonant frequency, a pump input, a signal input, and a signal output. The resonant circuit may include a Josephson junction connected to the pump input, the Josephson junction being a superconducting-normal-superconducting junction having two superconducting terminals and being configured to adjust the resonant frequency of the resonant circuit based on a signal received at the pump input.

17 Claims, 6 Drawing Sheets

(56) References Cited

OTHER PUBLICATIONS

Lee, Gil-Ho et al., "Graphene-based Josephson junction microwave bolometer", Feb. 28, 2019, 5 pages.
Roy, Ananda et al., "Introduction to parametric amplification of quantum signals with Josephson circuits", Comptes Rendus Physique, Aug. 10, 2016, pp. 740-755, vol. 17, Elsevier Masson SAS on behalf of Académie des sciences.
Walsh, Evan D. et al., "Graphene-Based Josephson-Junction Single-Photon Detector", Physical Review Applied, 2017, pp. 024022-1 through 024022-11, vol. 8, American Physical Society.
Yamamoto, T. et al., "Flux-driven Josephson parametric amplifier", Applied Physics Letters, Jul. 31, 2008, pp. 042510-1 through 042510-3, vol. 93, American Institute of Physics.
Zhong, L. et al., "Squeezing with a flux-driven Josephson parametric amplifier", New Journal of Physics, 2013, 25 pages, IOP Publishing Ltd and Deutsche Physikalische Gesellschaft.

* cited by examiner

JOSEPHSON PARAMETRIC AMPLIFIER BASED ON SUPERCONDUCTING-NORMAL-SUPERCONDUCTING JUNCTION

CROSS-REFERENCE TO RELATED APPLICATION(S)

The present application claims priority to and the benefit of U.S. Provisional Application No. 62/809,056, filed Feb. 22, 2019, entitled "JOSEPHSON PARAMETRIC AMPLIFIER BASED ON SUPERCONDUCTING-NORMAL-SUPERCONDUCTING JUNCTION", the entire content of which is incorporated herein by reference.

FIELD

One or more aspects of embodiments according to the present invention relate to an amplifier, and more particularly to a Josephson parametric amplifier based on a superconducting-normal-superconducting junction.

BACKGROUND

In various military and commercial applications, amplifiers capable of amplifying small signals without significantly degrading them through the addition of noise may be of use. Such applications may include sensitive radar and communications receivers (e.g., in mobile communications systems) and quantum computing systems.

SUMMARY

According to an embodiment of the present invention, there is provided an amplifier, including: a resonant circuit, having a resonant frequency; a pump input; a signal input; and a signal output, the resonant circuit including a Josephson junction connected to the pump input, the Josephson junction being a superconducting-normal-superconducting junction having two superconducting terminals and being configured to adjust the resonant frequency of the resonant circuit based on a signal received at the pump input.

In some embodiments, the pump input is the same input as the signal input.

In some embodiments, the resonant circuit is a resonant transmission-line circuit.

In some embodiments, the resonant transmission-line circuit includes a first section of transmission line and a second section of transmission line, and the two superconducting terminals of the Josephson junction are connected in series between the first section of transmission line and the second section of transmission line.

In some embodiments, the first section of transmission line has a length that is about the same as a length of the second section of transmission line.

In some embodiments, the length of the first section of transmission line is about one quarter of one wavelength at the resonant frequency.

In some embodiments, the Josephson junction has a gap including a portion of a graphene sheet.

In some embodiments, the Josephson junction has a control terminal for adjusting a series inductance of the Josephson junction, the control terminal being connected to the pump input.

In some embodiments, the control terminal is connected to a conductive gate on the portion of the graphene sheet.

In some embodiments, the graphene sheet is a middle layer of a graphene stack including: a first layer of hexagonal boron nitride immediately adjacent a first surface of the graphene sheet, the graphene sheet, and a second layer of hexagonal boron nitride immediately adjacent a second surface of the graphene sheet.

In some embodiments, the graphene sheet has an electron mobility of more than 100,000 $cm^2/V/s$.

In some embodiments, the amplifier further includes a substrate, the two superconducting terminals and the graphene stack being on the substrate.

In some embodiments, the substrate is a float zone crystalline silicon substrate.

In some embodiments, each of the first layer of hexagonal boron nitride and the second layer of hexagonal boron nitride has a thickness greater than 0.3 nm and less than 100 nm.

In some embodiments, the conductive gate is directly on the graphene stack.

In some embodiments, the amplifier further includes a gate insulating layer directly on the graphene stack, the conductive gate being directly on the gate insulating layer.

In some embodiments, the gate insulating layer is composed of aluminum oxide.

In some embodiments, the graphene sheet consists of a single atomic layer of graphene.

In some embodiments, the graphene sheet includes two atomic layers of graphene.

In some embodiments, the two superconducting terminals are composed of a material selected from the group consisting of niobium nitride, niobium titanium nitride, niobium diselenide, aluminum, niobium, niobium titanium, and lead.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a Josephson parametric amplifier based on a superconducting-normal-superconducting junction provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1A:
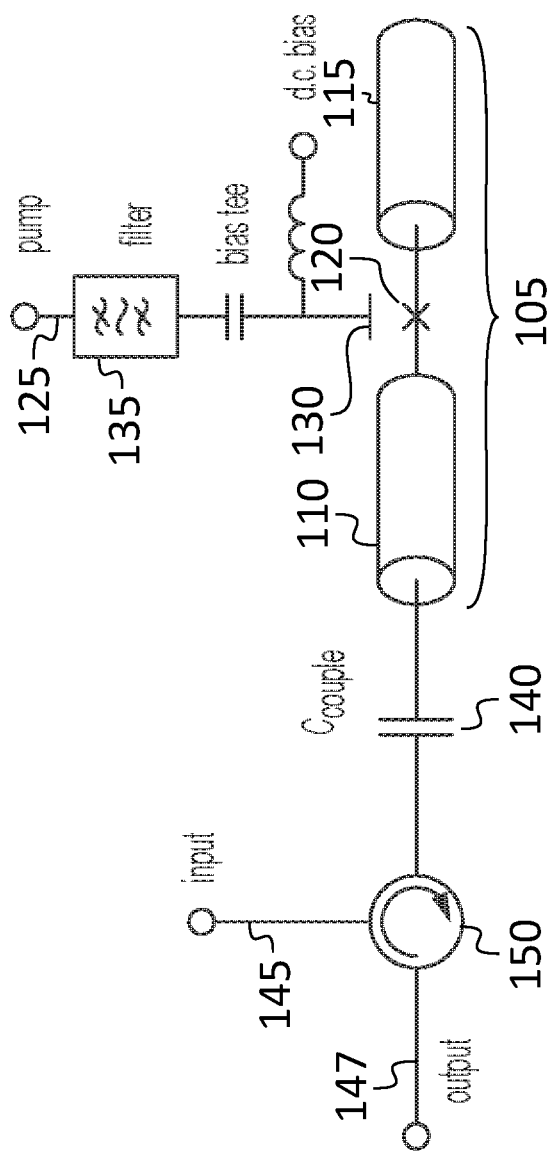
FIG. 1A is a parametric amplifier, according to an embodiment of the present invention.
Figure 1B:
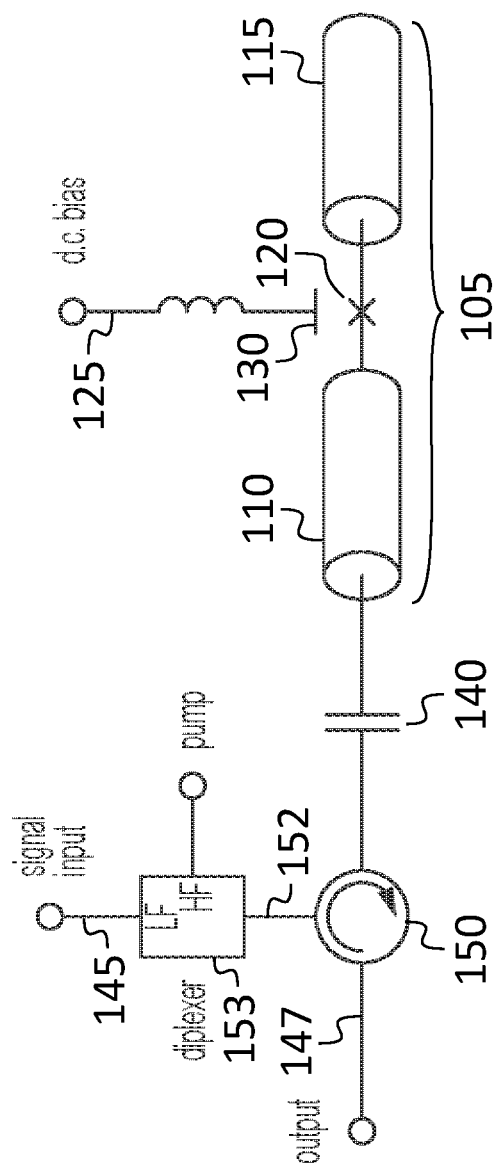
FIG. 1B is a parametric amplifier, according to an embodiment of the present invention.
Figure 1C:
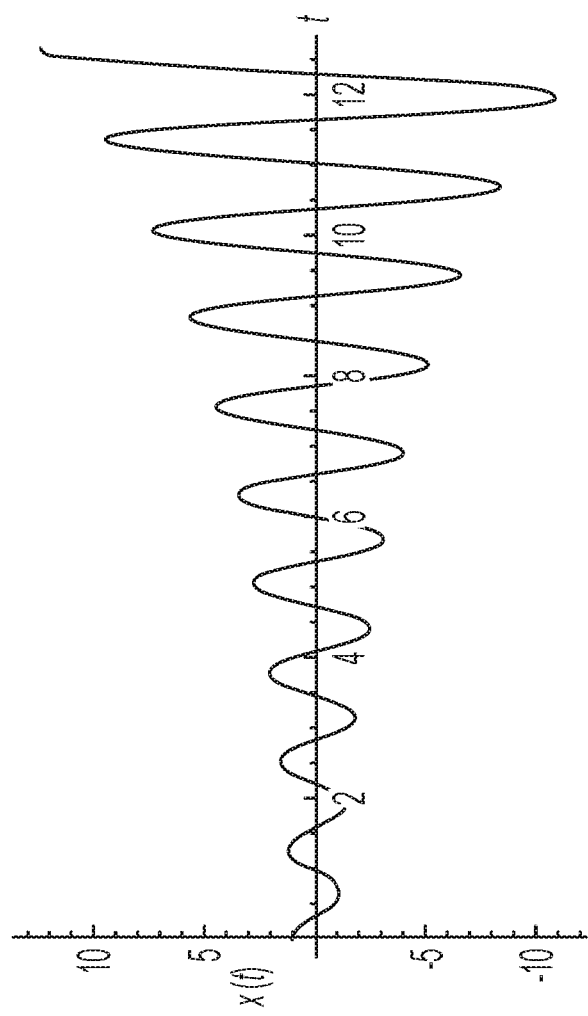
FIG. 1C is a waveform, according to an embodiment of the present invention.

Referring to FIGS. 1A and 1B, in some embodiments, a parametric amplifier includes a resonator having a resonant frequency that may be adjusted by controlling a parameter of the resonator. For example, the resonator may be a half-wave transmission line resonator 105 including a first quarter-wave section of transmission line 110, a second quarter-wave section of transmission line 115, and an adjustable impedance, such as a controllable Josephson junction 120, connected in series between the first quarter-wave section of transmission line 110 and the second quarter-wave section of transmission line 115. The Josephson junction 120 may operate as a controllable impedance (e.g., a controllable inductance) connected in series between the first quarter-wave section of transmission line 110 and the second quarter-wave section of transmission line 115. The Josephson junction 120 may (in a 3-wave mixing configuration illustrated in FIG. 1A) be controllable via a signal at the pump input 125 of the parametric amplifier, and it may increase the effective length of the resonator (i.e., reduce the resonant frequency) when the inductance is increased, and decrease the effective length of the resonator (i.e., reduce the resonant frequency) when the inductance is decreased. In a 4-wave mixing configuration (illustrated in FIG. 1B), the pump signal may be incident through a signal input of the parametric amplifier, in which case a single input 152 (fed, e.g., through a diplexer 153) operates as both a pump input and a signal input). When a pump signal is applied at a multiple of the nominal resonant frequency of the resonator (e.g., at twice the nominal resonant frequency of the resonator), a signal in the parametric amplifier (e.g., circulating in the half-wave transmission line resonator 105) may be amplified by parametric amplification. FIG. 1C shows a waveform with exponentially increasing amplitude that may correspond to the signal in the parametric amplifier for a pump signal of suitable amplitude at twice the resonant frequency. A parametric amplifier such as that of FIG. 1A may have little dissipative loss and may have a better noise figure than, e.g., a field effect transistor with a resistive channel which may be a source of thermal noise.

The Josephson junction 120 may be a superconducting-normal-superconducting Josephson junction. It may include two superconducting terminals separated by a gap containing a normal (i.e., non-superconducting conductive) material. In some embodiments, the gap includes a graphene sheet as the normal material. A conductive gate 130 may be on the graphene sheet (e.g., on one or more insulating layers that may be on the graphene sheet), and the potential applied to the gate (through the pump input 125) may result in an electric field at the graphene sheet, and result in adjusting the inductance of the Josephson junction. The graphene sheet may be a monolayer of graphene, or it may be a multilayer graphene sheet. In other embodiments, any other electrical gate-able (SNS) Josephson junction (in contrast to a Josephson junction configured for flux-based operation) may be employed instead of a Josephson junction. For example, the Josephson junction may be a nanowire Josephson junction, a semiconductor Josephson junction, or a Josephson junction constructed with any layer materials. A band-pass filter 135 may be present between the pump input 125 and the conductive gate 130, e.g., to block broadband noise, which may be produced by the circuit producing the pump signal, and which may otherwise compromise the performance of the parametric amplifier.

The outer ends of the first quarter-wave section of transmission line 110 and the second quarter-wave section of transmission line 115 (i.e., the left end of the first quarter-wave section of transmission line 110 and the right end of the second quarter-wave section of transmission line 115, as illustrated in FIG. 1A) may be open or nearly open (e.g., connected to other circuits or to ground by at most one or more high-impedance elements such as a small coupling capacitor 140). The input signal (i.e., the signal to be amplified) may be coupled into the parametric amplifier from the signal input 145 through a circulator 150 as shown, and the output signal (i.e., the amplified signal, which has been amplified by the parametric amplifier) may be coupled out of the parametric amplifier through the circulator 150 to the signal output 147.

The Josephson junction 120 need not be precisely at the center of the half-wave transmission line resonator 105, and in some embodiments the Josephson junction 120 is offset from the center (i.e., the first quarter-wave section of transmission line 110 and the second quarter-wave section of transmission line 115 do not have exactly equal lengths); the effect of such an offset may be to reduce the change in resonant frequency that occurs for a given change in the inductance of the Josephson junction 120. In some embodiments the ends of the half-wave transmission line resonator may be shorted to ground (or nearly shorted to ground) instead of being open (or nearly open) as in the embodiment of FIG. 1A; in such an embodiment the Josephson junction 120 may be connected in series at or near one of the ends of the half-wave transmission line resonator.

Figure 1D:
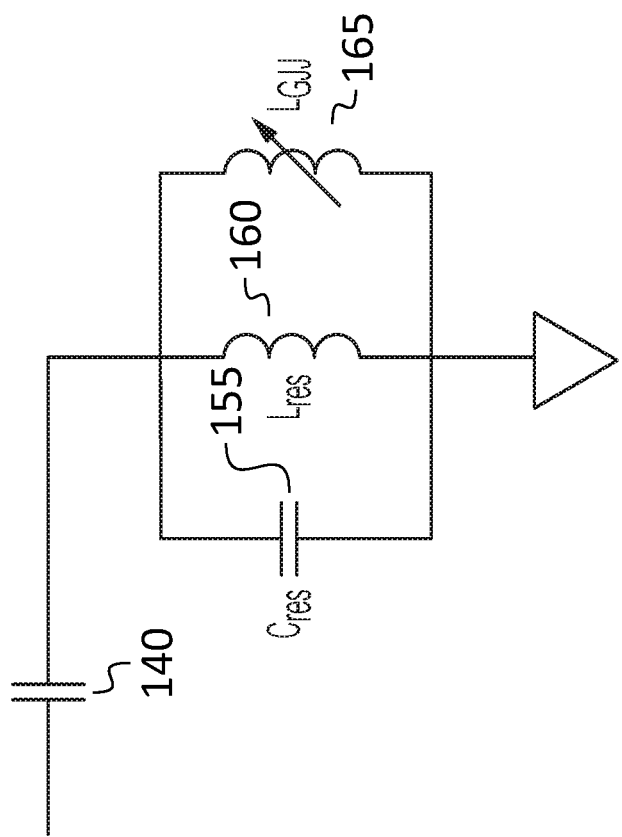
FIG. 1D is a circuit or equivalent circuit for a parametric amplifier, according to an embodiment of the present invention.

FIG. 1D shows (i) an equivalent circuit diagram of the resonator of FIG. 1A, that may be used as a model of the half-wave transmission line resonator 105 over a range of frequencies near the resonant frequency or (ii) an alternate resonator circuit that may be employed for parametric amplification (e.g., at frequencies at which the performance of lumped elements may be acceptable). The circuit includes a resonant capacitor 155 and a resonant inductor 160, as well as the coupling capacitor 140. The Josephson junction 120 and the conductive gate 130 that may be used to control its inductance are illustrated, in FIG. 1D, as the variable inductor 165.

The parametric amplifier my amplify one phase of a signal and attenuate the phase that is separated by 90 degrees from the phase that is amplified, operating in what is known as phase-sensitive mode. In some embodiments, where the quarter-wave transmission lines 110 and 115 are of different length (different resonance frequency), it may also operate in phase-insensitive mode, amplifying both phases of an input signal, while adding at least half a quanta of noise to the output signal.

Figure 2A:
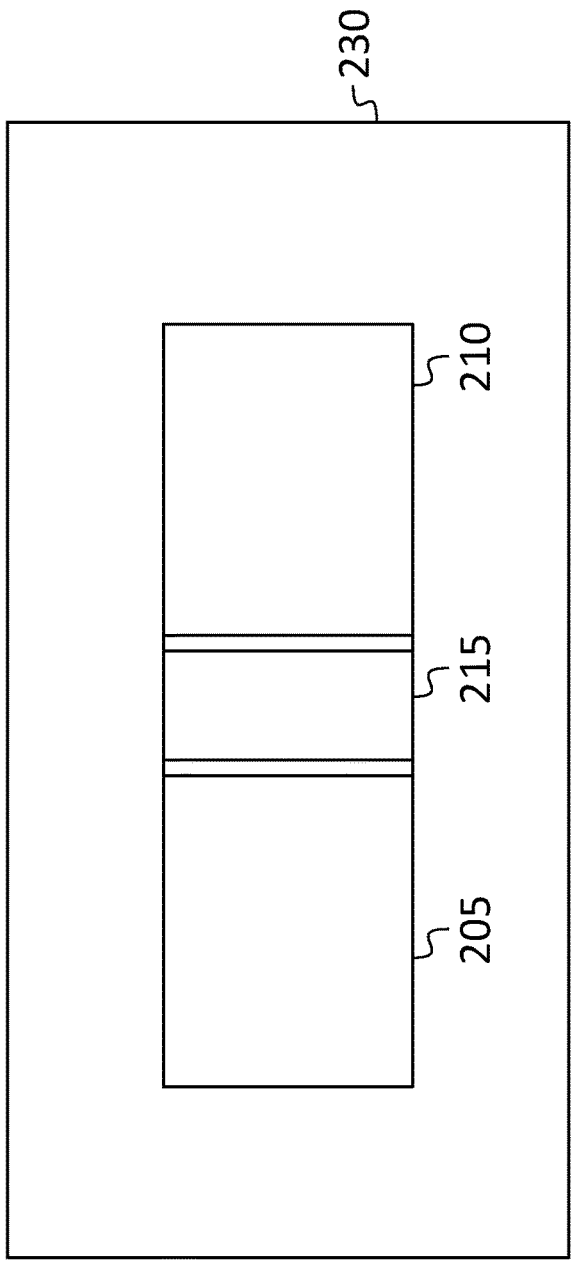
FIG. 2A is a top view of a controllable Josephson junction, according to an embodiment of the present invention.
Figure 2B:
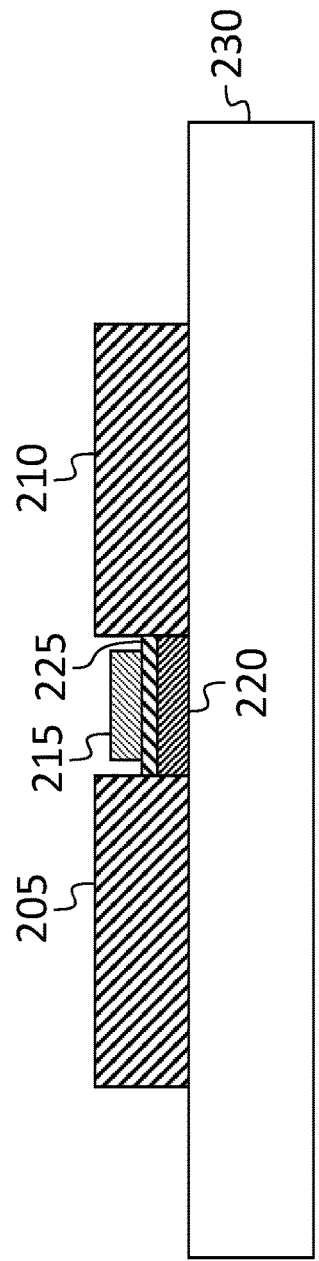
FIG. 2B is a side view of a controllable Josephson junction, according to an embodiment of the present invention.

FIGS. 2A and 2B are a schematic top view and side view of a controllable Josephson junction according to some embodiments. The controllable Josephson junction has a first superconducting terminal 205, a second superconducting terminal 210, and a conductive gate 130. As used herein, a "superconducting terminal" is a terminal composed of a material that behaves as a superconductor under suitable conditions, e.g., at sufficiently low temperature and current density. As such, the two superconducting terminals of the controllable Josephson junction of FIGS. 2A and 2B may be referred to as two superconducting terminals regardless of whether the controllable Josephson junction is at sufficiently low temperature for the two superconducting terminals to be superconducting.

The first superconducting terminal 205 and the second superconducting terminal 210 may each be composed of any of a number of materials known in the art that become superconductive at low temperatures, including niobium nitride, niobium titanium nitride, niobium diselenide, molybdenum rhenium alloy, aluminum, niobium, niobium titanium, or lead.

Figure 3:
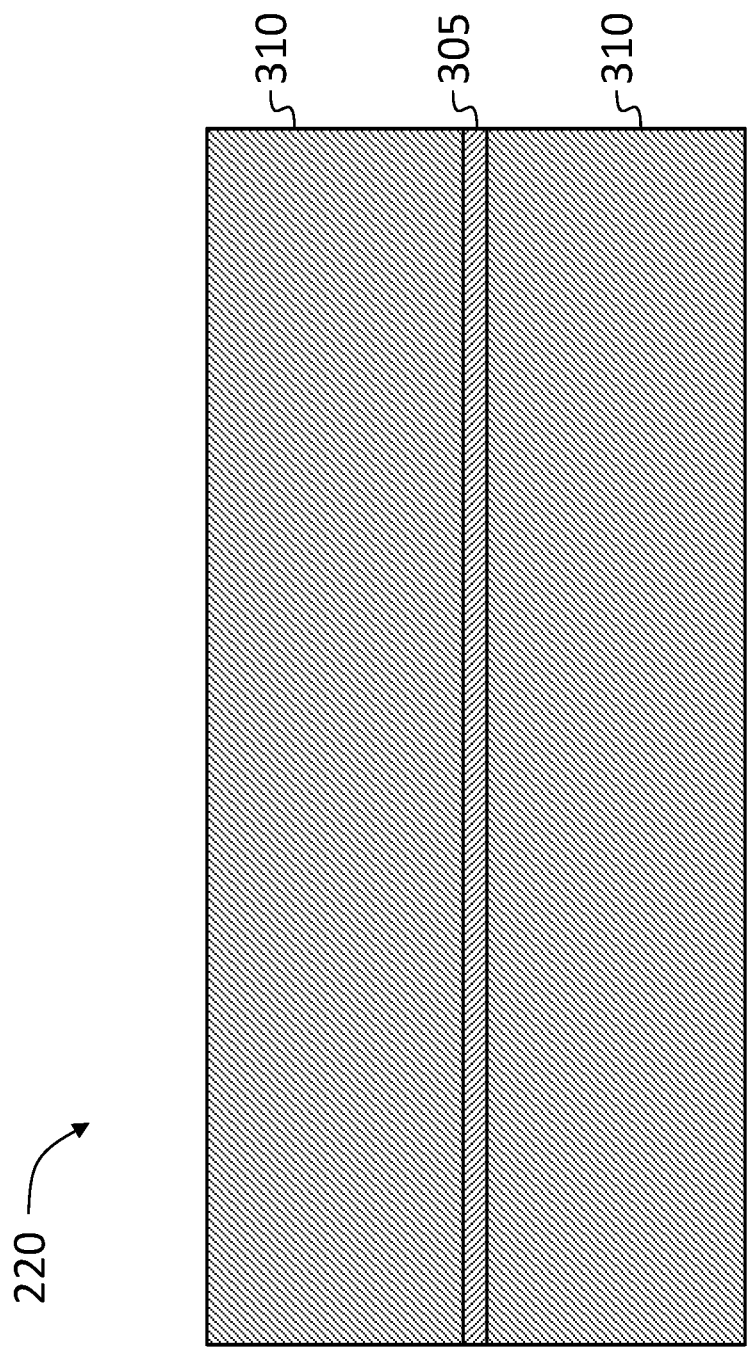
FIG. 3 is a side cross-sectional view of a graphene stack, according to an embodiment of the present invention.

In some embodiments, a graphene sheet forms the normal portion within the gap of the controllable Josephson junction (which, as mentioned above, may be a superconducting-normal-superconducting Josephson junction). The graphene sheet may be part of a graphene stack 220, an enlarged view of a portion of which is shown in FIG. 3. The graphene stack 220 may include the graphene sheet 305, between two insulating layers 310, e.g., between two layers of hexagonal boron nitride. The graphene sheet 305 may consist of one, two, three, four, or as many as ten atomic layers of graphene. Each layer 310 of hexagonal boron nitride may be between 0.3 nm and 100 nm thick; the layers 310 of hexagonal boron nitride may keep the surface of the graphene sheet 305 clean, i.e., they may prevent surface contamination from compromising the properties of the graphene sheet 305.

Each hexagonal boron nitride layer 310 may be a single crystal, with an atomically flat surface facing the graphene sheet 305. Each hexagonal boron nitride layer 310 may be annealed, e.g., at 250° C. for 10-15 minutes, before the stack is assembled. The stack may be formed by first bringing a first layer 310 of hexagonal boron nitride into contact with the graphene sheet 305, resulting in adhesion of the graphene sheet 305 to the hexagonal boron nitride by van der Waals forces, and then bringing the graphene sheet 305, on the first layer 310 of hexagonal boron nitride, into contact with the second layer 310 of hexagonal boron nitride, resulting in adhesion, again by van der Waals forces, at the interface between the graphene sheet 305 and the second layer 310 of hexagonal boron nitride. The edges of the stack may then be etched, e.g. using plasma etching, so that the edges of the two layers 310 of hexagonal boron nitride and the edges of the graphene sheet 305 in the structure remaining after the etch process coincide (i.e., are aligned). In some embodiments, the graphene sheet is kept sufficiently clean during fabrication of the graphene stack 220, and thereafter by the protective layers 310 of hexagonal boron nitride, that the graphene sheet has an electron mobility of more than 100,000 $cm^2/V/s$.

In some embodiments the first superconducting terminal 205 and the second superconducting terminal 210 make contact with respective (e.g., opposite) edges of the graphene sheet 305 by abutting against respective edges of the graphene stack 220 as shown, or, in other embodiments, by extending up onto the top surface of the graphene stack 220 (e.g., by being deposited, onto the graphene stack 220, as a patch extending across the edge of the graphene stack 220) so that respective vertical or steeply inclined portions, of the first superconducting terminal 205 and of the second superconducting terminal 210, are in contact with an edge of the graphene sheet 305 or in sufficiently close proximity with an edge of the graphene sheet 305 that charge may be transported between the graphene sheet 305 and the first superconducting terminal 205, and between the graphene sheet 305 and the second superconducting terminal 210, by tunneling across the gaps between the graphene sheet 305 and the first superconducting terminal 205, and between the graphene sheet 305 and the second superconducting terminal 210.

Referring again to FIG. 2B, in some embodiments a gate insulating layer 225, e.g., a layer of aluminum oxide, hafnium oxide, or an additional, separately formed, layer of hexagonal boron nitride, may be between the conductive gate 130 and the graphene stack 220. In other embodiments, the graphene stack may be positioned on top of a prefabricated conductive gate. In such cases, the gate may be covered with an insulating layer before the stack is positioned, or the insulating layer may be part of the stack, e.g. the bottom layer of hexagonal boron nitride.

The controllable Josephson junction of FIGS. 2A and 2B is formed, in some embodiments, by placing the graphene stack 220 on a substrate 230, depositing the first superconducting terminal 205 and the second superconducting terminal 210 on the substrate 230 (and onto the graphene stack 220, if they overlap onto the graphene stack 220), depositing the gate insulating layer 225 (if it is present) on the graphene stack 220, and depositing the conductive gate 130 onto the gate insulating layer 225 (or, if the gate insulating layer 225 is absent, directly onto the graphene stack 220).

Contacts to external circuitry may be formed, for example, by forming wire bonds to the first superconducting terminal 205, to the second superconducting terminal 210, and to the conductive gate 130. In some embodiments, the deposition steps are performed in a different order, to similar effect.

In some embodiments a plurality of controllable Josephson junctions, or one or more controllable Josephson junctions and one or more other elements (such as the half-wave transmission line resonator 105 or the band-pass filter 135), or a plurality of parametric amplifiers, may be fabricated on a single substrate 230. The substrate 230 may be a silicon substrate 230, and it may be selected for low conductivity, to reduce interactions between the active elements of the controllable Josephson junction and the substrate 230. The substrate 230 may be composed, for example, of highly resistive crystalline silicon having a low doping level, such as float zone silicon.

In operation, the controllable Josephson junction may behave, when the conductive gate 130 is at the same potential, or at substantially the same potential, as the first superconducting terminal 205 and as the second superconducting terminal 210, as a Josephson junction, forming a superconducting connection (with an inductance that depends on the gate voltage) between the first superconducting terminal 205 and the second superconducting terminal 210 when the current flowing between the first superconducting terminal 205 and the second superconducting terminal 210 is less than a critical current of the Josephson junction, and forming a normal connection between the first superconducting terminal 205 and the second superconducting terminal 210 when the current exceeds the critical current of the Josephson junction. In operation, a voltage may be applied to the conductive gate 130 of the controllable Josephson junction, affecting the charge density of its normal section by field effect doping. This in turn changes its critical Josephson current, and hence the effective inductance between the two superconducting terminals.

As used herein, "a portion of" something means all, or less than all, of the thing. As such, for example "a portion of a graphene sheet" means all or less than all of the graphene sheet.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Although limited embodiments of a Josephson parametric amplifier based on a superconducting-normal-superconducting junction have been specifically described and illustrated herein, many modifications and variations will be apparent to those skilled in the art. Accordingly, it is to be understood that a Josephson parametric amplifier based on a superconducting-normal-superconducting junction employed according to principles of this invention may be embodied other than as specifically described herein. The invention is also defined in the following claims, and equivalents thereof.

What is claimed is:

1. An amplifier, comprising:
a resonant circuit, having a resonant frequency;
a pump input;
a signal input; and
a signal output,
the resonant circuit comprising a Josephson junction connected to the pump input,
the Josephson junction being a superconducting-normal-superconducting junction having two superconducting terminals and being configured to adjust the resonant frequency of the resonant circuit based on a signal received at the pump input,
wherein:
the resonant circuit is a resonant transmission-line circuit comprising a first section of transmission line and a second section of transmission line, and
the two superconducting terminals of the Josephson junction are connected in series between the first section of transmission line and the second section of transmission line.

2. The amplifier of claim 1, wherein the pump input is the same input as the signal input.

3. The amplifier of claim 1, wherein the first section of transmission line has a length that is about the same as a length of the second section of transmission line.

4. The amplifier of claim 1, wherein the first section of transmission line has a length that is about one quarter of one wavelength at the resonant frequency.

5. An amplifier, comprising:
a resonant circuit, having a resonant frequency;
a pump input;
a signal input; and
a signal output,
the resonant circuit comprising a Josephson junction connected to the pump input,
the Josephson junction being a superconducting-normal-superconducting junction having two superconducting terminals and being configured to adjust the resonant frequency of the resonant circuit based on a signal received at the pump input,
wherein:
the Josephson junction has a gap comprising a portion of a graphene sheet, and
the Josephson junction has a control terminal for adjusting a series inductance of the Josephson junction, the control terminal being connected to the pump input.

6. The amplifier of claim 5, wherein the graphene sheet comprises two atomic layers of graphene.

7. The amplifier of claim 5, wherein the two superconducting terminals are composed of a material selected from the group consisting of niobium nitride, niobium titanium nitride, niobium diselenide, aluminum, niobium, niobium titanium, and lead.

8. The amplifier of claim 5, wherein the control terminal is connected to a conductive gate on the portion of the graphene sheet.

9. The amplifier of claim 8, wherein:
the graphene sheet is a middle layer of a graphene stack comprising:
a first layer of hexagonal boron nitride immediately adjacent a first surface of the graphene sheet,
the graphene sheet, and
a second layer of hexagonal boron nitride immediately adjacent a second surface of the graphene sheet; and
the conductive gate is directly on the graphene stack.

10. The amplifier of claim 5, wherein the graphene sheet is a middle layer of a graphene stack comprising:
a first layer of hexagonal boron nitride immediately adjacent a first surface of the graphene sheet,
the graphene sheet, and
a second layer of hexagonal boron nitride immediately adjacent a second surface of the graphene sheet.

11. The amplifier of claim 5, wherein the graphene sheet has an electron mobility of more than 100,000 $cm^2/V/s$.

12. The amplifier of claim 10, further comprising a substrate, the two superconducting terminals and the graphene stack being on the substrate.

13. The amplifier of claim 12, wherein the substrate is a float zone crystalline silicon substrate.

14. The amplifier of claim 10, wherein each of the first layer of hexagonal boron nitride and the second layer of hexagonal boron nitride has a thickness greater than 0.3 nm and less than 100 nm.

15. The amplifier of claim 9, further comprising a gate insulating layer directly on the graphene stack, the conductive gate being directly on the gate insulating layer.

16. The amplifier of claim 15, wherein the gate insulating layer is composed of aluminum oxide.

17. The amplifier of claim 15, wherein the graphene sheet consists of a single atomic layer of graphene.

* * * * *